(12) United States Patent
Pietambaram et al.

(10) Patent No.: US 7,684,161 B2
(45) Date of Patent: Mar. 23, 2010

(54) METHODS AND APPARATUS FOR A SYNTHETIC ANTI-FERROMAGNET STRUCTURE WITH REDUCED TEMPERATURE DEPENDENCE

(75) Inventors: Srinivas V. Pietambaram, Chandler, AZ (US); Renu W. Dave, Chandler, AZ (US); Jon M. Slaughter, Tempe, AZ (US); JiJun Sun, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 912 days.

(21) Appl. No.: 11/406,566

(22) Filed: Apr. 18, 2006

(65) Prior Publication Data

US 2007/0243639 A1 Oct. 18, 2007

(51) Int. Cl.
*G11B 5/39* (2006.01)
*G11B 5/127* (2006.01)
(52) U.S. Cl. .............................. 360/324.12; 428/811.3; 428/811.5; 428/816; 428/811.2
(58) Field of Classification Search ........................ None
See application file for complete search history.

(56) References Cited

U.S. PATENT DOCUMENTS

| | | | |
|---|---|---|---|
| 6,548,186 B1 * | 4/2003 | Carey et al. ................. | 428/611 |
| 6,775,183 B2 | 8/2004 | Heide | |
| 6,818,330 B2 * | 11/2004 | Shukh et al. ................. | 428/828 |
| 2004/0213071 A1 * | 10/2004 | Hiramoto et al. ............ | 365/232 |
| 2005/0244679 A1 * | 11/2005 | Arai et al. .................... | 428/828 |
| 2006/0012926 A1 | 1/2006 | Parkin | |
| 2006/0211198 A1 * | 9/2006 | Horng et al. ................. | 438/257 |
| 2006/0279981 A1 * | 12/2006 | Diao et al. ................... | 365/158 |

OTHER PUBLICATIONS

International Search Report and Written Opinion of PCT/US07/63045.

* cited by examiner

*Primary Examiner*—Kevin M Bernatz
(74) *Attorney, Agent, or Firm*—Ingrassia Fisher & Lorenz, P.C.

(57) ABSTRACT

A synthetic antiferromagnet (SAF) structure includes a first ferromagnetic layer, a first insertion layer, a coupling layer, a second insertion layer, and a second ferromagnetic layer. The insertion layers comprise materials selected such that SAF exhibits reduced temperature dependence of antiferromagnetic coupling strength. The insertion layers may include CoFe or CoFeX alloys. The thickness of the insertion layers is selected such that they do not increase the uniaxial anisotropy or deteriorate any other properties.

18 Claims, 2 Drawing Sheets

METHODS AND APPARATUS FOR A SYNTHETIC ANTI-FERROMAGNET STRUCTURE WITH REDUCED TEMPERATURE DEPENDENCE

TECHNICAL FIELD

The present invention relates generally to magneto-resistive device structures and, more particularly, to magnetoresistive devices with an improved synthetic anti-ferromagnet (SAF) structure.

BACKGROUND

Magneto-electronic devices such as magnetoresistive random access memory (MRAM) cells, magnetic sensors, readheads, and the like have become increasingly popular in recent years due to the large signal available from recently-developed magnetoresistive materials. MRAM has the advantages of nonvolatile storage, radiation resistance, fast read and write operations, and much better endurance than other nonvolatile memories. Such devices typically incorporate a magnetic tunnel junction (MTJ) structure (or "stack") that includes multiple ferromagnetic layers separated by one or more non-magnetic layers. A typical MTJ stack might include two synthetic anti-ferromagnets (SAFs)—a free-layer SAF, and a pinned SAF.

Such SAFs are temperature dependant. That is, their magnetic properties are strongly dependent upon the ambient thermal environment which limits the range of temperatures at which the device may operate. For example, the antiferromagnetic coupling strength, typically represented by the saturation field, $H_{sat}$, of a NiFe SAF measured at temperature typically drops, as temperature is increased, at a rate of about 0.4%/° C. The saturation field, $H_{sat}$ is defined as the field needed to align the moments of the two ferromagnetic layers in a SAF parallel to each other. This drop, though reversible, leads to a reduced operating window at elevated temperature as the $H_{sat}$ is an important parameter determining both the minimum switching field of the bit and the upper limit of the operating range of the bit.

The uniaxial anisotropy of the material, $H_k$ also affects the switching field of the bit and the size of the operating window. Hence the SAF material must be chosen also for the optimum uniaxial anisotropy. For MRAM devices with significant shape anisotropy, it is desirable to minimize the anisotropy of the material to keep the switching field low and the operating window large. The uniaxial anisotropy of the material is expressed as the field needed to saturate the magnetic moment of that material along the hard axis.

SAFs also can contribute to an increase in device resistance resulting from high processing temperatures or long times at operating temperatures. The increase in resistance is primarily due to thermally-activated oxidation of SAF material around the edges of the patterned bits. The oxidation encroachment leads to an increase in the resistance of the MTJ as the bit borders become non-conducting, effectively reducing the area of the MTJ; this effect causes a larger relative resistance increase in smaller MTJ bits. Hence, reducing oxygen encroachment effects would lead to less increase in the resistance of the patterned bits, smaller differences between different size bits (improved scaling) and allowing higher temperature treatments.

Accordingly, it is desirable to provide a MTJ stack with better high-temperature operation and reduced resistance scaling from oxygen encroachment. Maintaining a low uniaxial anisotropy of the ferromagnetic layers is typically desirable. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

The invention may be described herein in terms of functional and/or logical block components and various processing steps. It should be appreciated that such block components may be realized by any number of hardware, software, and/or firmware components configured to perform the specified functions. For the sake of brevity, conventional techniques related to semiconductor processing (e.g., physical vapor deposition, ion beam deposition, etc) as well as the operation of conventional magnetoresistive random access memories (MRAMs) may not be described in detail herein. It should be noted that many alternative or additional functional relationships or physical connections may be present in a practical embodiment.

In general, a free-layer synthetic anti-ferromagnet (SAF) structure in accordance with one embodiment incorporates CoFe and/or CoFeB insertion layers on both sides of the coupling layer in conjunction with top and bottom ferromagnetic layers (comprising, for example, NiFe or CoFeB).

Figure 1:
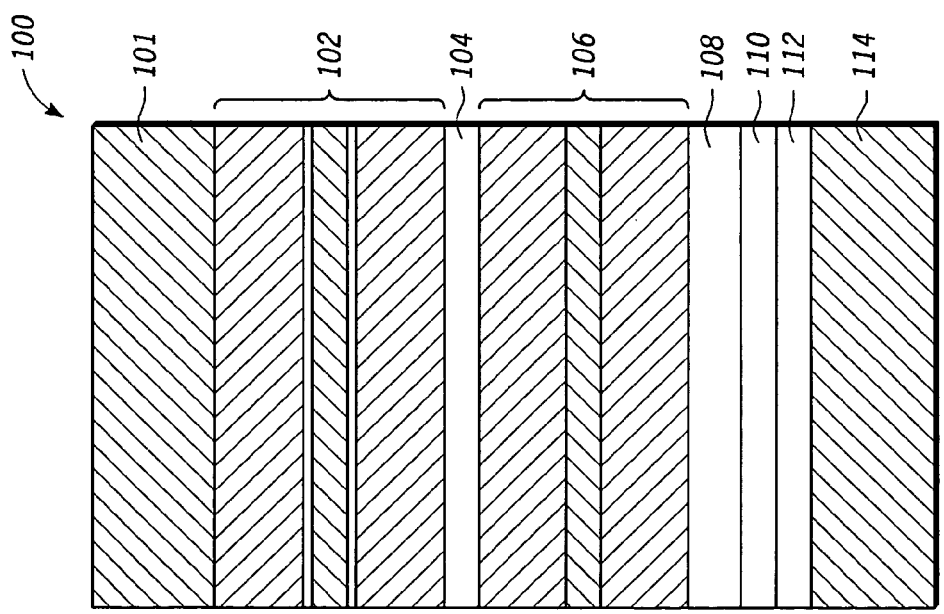
FIG. 1 is a cross-sectional overview of an exemplary magnetic tunnel junction stack.

More particularly, with reference to FIG. 1, a magnetic tunnel junction (MTJ) 100 useful in describing the present invention generally includes a top electrode 101, a free-layer synthetic anti-ferromagnet (or "SAF") 102, a pinned SAF 106, a dielectric layer (e.g., $AlO_x$) 104 separating SAF 102 from SAF 106, an anti-ferromagnetic pinning layer 108, a template layer 110, a seed layer 112, and a second electrode (or "base electrode") 114. As is known, the orientation of free-layer SAF 102 may be switched from parallel to anti-parallel with respect to pinned SAF 106 (which is pinned by virtue of pinning layer 108), thus providing two resistive states that can be stored and read in connection with a memory device. The general structure and operation of MTJ 100 is known in the art, and thus need not be described in detail herein.

Figure 2:
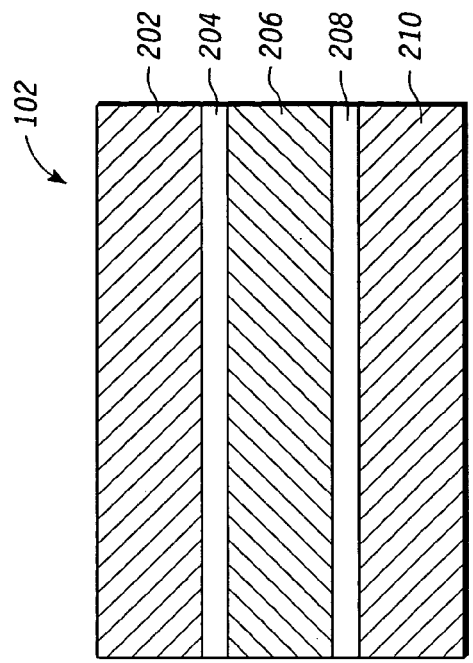
FIG. 2 is a cross-sectional overview of a synthetic anti-ferromagnet as shown in FIG. 1 in accordance with one embodiment.

Referring to FIG. 2, an exemplary free layer SAF 102 in accordance with one embodiment generally includes a bottom ferromagnetic layer (or "FM-layer") 210, an insertion layer (or "IL-Y") 208, a coupling layer (or "spacer") 206, a second insertion layer (or "IL-X") 204, and a topmost FM-layer 202.

Insertion layers 204 and 208 (IL-X and IL-Y, respectively) may include any material now known or later developed that provides the desired temperature dependence and uniaxial anisotropy. In one embodiment, both IL-X 204 and IL-Y 208 include a metal alloy containing boron—e.g., a cobalt-iron (CoFe) compound. It has been discovered by the present inventors that it is advantageous for IL-X 204 and IL-Y 208 to comprise different materials. In one embodiment, for example, IL-Y 208 is CoFe and IL-X 204 is CoFeX, where X is boron, tantalum, zirconium, nickel or the like.

In accordance with one embodiment, IL-X comprises CoFeB, and IL-Y comprises CoFe, where in both cases the atomic percentage of Fe is greater than approximately 9%—preferably between 9% and 25%. In a further embodiment, IL-X includes greater than approximately 9% boron.

In a particular embodiment, both IL-X 204 and IL-Y 208 have a thickness of less than approximately 10 Å. It will be appreciated that the present invention is not so limited, however, and that the thicknesses of the various layers in the MTJ stack may be selected in accordance to achieve the desired electrical/magnetic characteristics. More generally, it is known that the layers of the MTJ stack may be adjusted to arrive at a preferred level of magnetostriction.

Coupling layer 206 may include any of the various materials traditionally used in connection with magneto-resistive devices. In one embodiment, for example, coupling layer 206 is a layer of ruthenium having a thickness of between approximately 8 Å and 25 Å. A number of other materials may be used, however, including rhodium, chromium, vanadium, molybdenum, etc as well as alloys of these such as ruthenium-tantalum, and the like.

FM Layers 202 and 210 may include any suitable ferromagnetic material. In one embodiment, for example, FM layer 202 and FM layer 210 are NiFe layers having a thickness of greater than approximately 25 Å. In another embodiment, one or more of FM layers 202 and 210 comprises CoFeB having a thickness approximately greater than 25 Å

IL-X 204, IL-Y 208, FM layer 202, FM layer 210, and coupling layer 206 may be formed using a variety of conventional techniques known in the art. Suitable deposition methods include, for example, physical vapor deposition, and ion-beam deposition.

Figure 3:
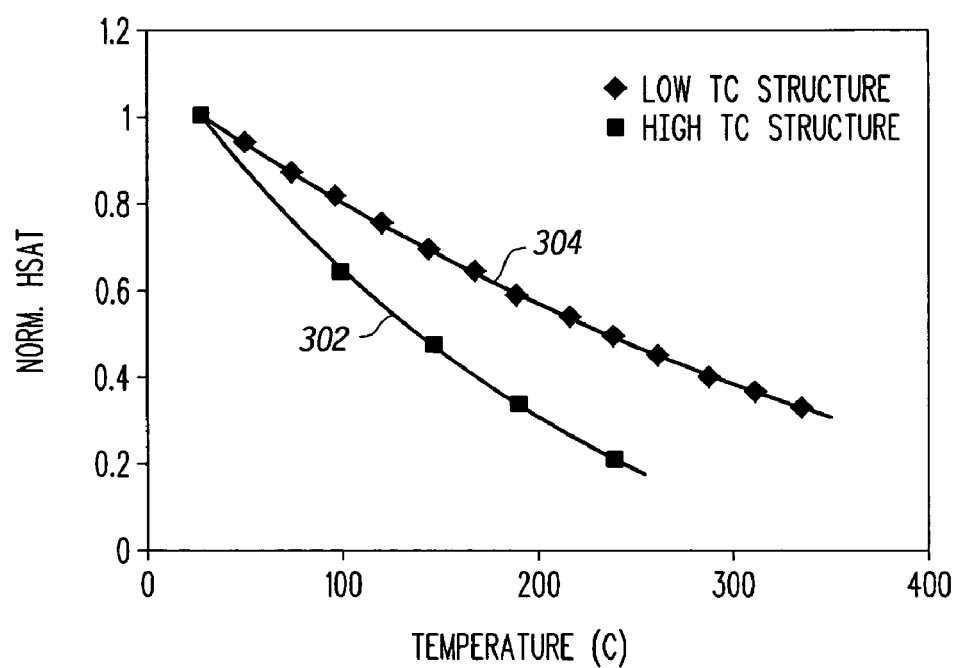
FIG. 3 is a graph comparing, between prior art systems and an exemplary embodiment, temperature dependence of $H_{sat}$.

As mentioned previously, it is advantageous for SAF 102 to exhibit a low temperature dependence of $H_{sat}$. Referring to FIG. 3, $H_{sat}$ generally varies inversely (but non-linearly) with temperature, and decreases monotonically as temperature increases. Two curves are shown: one (curve 302) corresponding to a relatively high temperature coefficient, and another (curve 304) corresponding to a lower temperature coefficient, where $H_{sat}$ is depicted as a normalized value. It has been observed by the present inventors that $H_{sat}$ generally exhibits 1/T dependence. The slope ($dH_{sat}/dT$) of the $H_{sat}$ curve at any point is the temperature coefficient at that operating temperature. As can be seen, curve 304 has a "flatter" slope than curve 302, and thus its temperature coefficient within the illustrated range is less than that of curve 302. The operating temperature of the SAF device will vary depending upon the application, the ambient temperature, and the like, but generally spans, worst-case, from −40° C. to 175° C., and more typically ranges from 0° C. to 85° C. In this regard, the phrase "temperature coefficient of $H_{sat}$," as used herein to refer to a particular layer, means the average temperature coefficient of $H_{sat}$, within a given operating temperature range, for SAF 102 if all layers 202, 204, 208, and 210 consisted of the same material used for that layer. It has been observed by the present inventors that the $H_{sat}$ temperature dependence of SAF 102 is controlled by the material used for the insertion layers IL-X 204 and IL-Y 208. Thus, in accordance with one embodiment, bottom FM layer 210 has a first temperature coefficient of $H_{sat}$, IL-Y 208 has a second temperature coefficient of $H_{sat}$, FM layer 202 has a third temperature coefficient of $H_{sat}$, and IL-X layer 204 has a fourth temperature coefficient of $H_{sat}$, wherein the second temperature coefficient of $H_{sat}$ is less than the first temperature coefficient of $H_{sat}$, and the fourth temperature coefficient of $H_{sat}$ is less than the third coefficient of $H_{sat}$.

It has furthermore been observed by the inventors that oxygen encroachment is reduced (i.e. the resistance scaling of the SAF 102 is improved) when one of the ILs X and Y is a CoFeX alloy, X being one of boron, zirconium, tantalum, nickel or the like.

As previously mentioned, it is desirable to reduce the temperature dependence and resistance scaling of the SAF while maintaining desirable magnetic properties, for example a low uniaxial anisotropy ($H_k$) needed for devices with their total uniaxial anisotropy determined largely by shape anisotropy. The structures described herein have been found to exhibit an $H_k$ of less than approximately 30 Oe and improved temperature dependence and resistance scaling. Furthermore, by improving the temperature dependence of $H_{sat}$, one can improve the temperature dependence of the switching currents and operating currents of the SAF.

In summary, what has been described is a synthetic antiferromagnet structure comprising a bottom ferromagnetic layer; a first insertion layer formed on the bottom ferromagnetic layer; a coupling layer formed on the first insertion layer; a second insertion layer formed on the coupling layer; and a top ferromagnetic layer formed on the second insertion layer; wherein the bottom ferromagnetic layer has a first temperature coefficient of $H_{sat}$, the first insertion layer has a second temperature coefficient of $H_{sat}$, the top ferromagnetic layer has a third temperature coefficient of $H_{sat}$, and the second insertion layer has a fourth temperature coefficient of $H_{sat}$, and wherein the second temperature coefficient of $H_{sat}$ is less than the first temperature coefficient of $H_{sat}$, and the fourth temperature coefficient of $H_{sat}$ is less than the third coefficient of $H_{sat}$.

In one embodiment, the second insertion layer comprises CoFeX, where X is selected from the group consisting of boron, tantalum, zirconium, and nickel. In a particular embodiment, the second insertion layer comprises CoFeB with atomic concentration of boron greater than approximately 9%. In another embodiment, the second insertion layer and the first insertion layer include greater than approximately nine percent (9%) iron. In another, the first insertion layer has a thickness of less than approximately 10 Å and the second insertion layer has a thickness of less than approximately 10 Å.

In accordance with another embodiment, the first ferromagnetic layer and the second ferro-magnetic layer are selected from the group consisting of nickel-iron (NiFe), and cobalt-iron-boron (CoFeB). In one embodiment, the first ferromagnetic layer has a thickness greater than approximately 25 Å, and the second ferro-magnetic layer has a thickness greater than approximately 25 Å. The coupling layer may comprise, for example, ruthenium.

In one embodiment, the first insertion layer comprises cobalt-iron (CoFe) and the second insertion layer comprises cobalt-iron-boron (CoFeB). In another, the top ferro-magnetic layer and the bottom ferro-magnetic layer are selected from the group consisting of nickel-iron (NiFe) and cobalt-iron-boron (CoFeB).

In a particular embodiment, the first insertion layer has a thickness of less than approximately 10 Å, the second insertion layer has a thickness of less than approximately 10 Å, the top ferro-magnetic layer has a thickness of greater than approximately 25 Å, and the bottom ferro-magnetic layer has a thickness of greater than approximately 25 Å.

A method for forming a synthetic anti-ferromagnet structure in accordance with another embodiment includes: forming a bottom ferromagnetic layer; forming, via deposition of CoFe, a first insertion layer on the bottom ferromagnetic layer; forming a coupling layer on the first insertion layer; forming, via deposition of CoFeB, a second insertion layer on the coupling layer; and forming a top ferro-magnetic layer on the second insertion layer.

In one embodiment, the step of forming the first insertion layer includes forming a CoFe layer having an iron content of greater than approximately 9% and the step of forming the second insertion layer includes forming a CoFeB layer having an iron content of greater than approximately 9%.

In another embodiment, the step of forming the first insertion layer includes forming a CoFe layer having an iron content between approximately 9% and 25%, and the step of forming the second insertion layer includes forming a CoFeB layer having an iron content of between approximately 9% and 25%.

In a further embodiment, the step of forming the first insertion layer includes forming a CoFe layer having a thickness of less than approximately 10 Å and the step of forming the second insertion layer includes forming a CoFeB layer having a thickness of less than approximately 10 Å.

In one embodiment, the step of forming the bottom ferromagnetic layer and the step of forming the top ferro-magnetic layer includes forming a layer of NiFe having a thickness greater than approximately 25 Å.

In yet another embodiment, the step of forming the bottom ferro-magnetic layer and the step of forming the top ferro-magnetic layer includes forming a layer of CoFeB having a thickness greater than approximately 25 Å.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. A synthetic anti-ferromagnet (SAF) structure comprising:
  a bottom ferromagnetic layer;
  a first insert ion layer comprising a first material and formed on the bottom ferromagnetic layer;
  a coupling layer formed on the first insertion layer;
  a second insertion layer comprising a second material different from the first material and formed on the coupling layer; and
  a top ferromagnetic layer formed on the second insertion layer;
  wherein the bottom ferromagnetic layer has a first temperature coefficient of $H_{sat}$, the first insertion layer has a second temperature coefficient of $H_{sat}$, the top ferromagnetic layer has a third temperature coefficient of $H_{sat}$, and the second insertion layer has a fourth temperature coefficient of $H_{sat}$, and wherein the second temperature coefficient of $H_{sat}$ is less than the first temperature coefficient of $H_{sat}$, and the fourth temperature coefficient of $H_{sat}$ is less than the third temperature coefficient of $H_{sat}$.

2. The structure of claim 1, wherein at least one of the first insertion layer and second insertion layer comprise CoFe.

3. The structure of claim 2, wherein at least one of the first insertion layer and the second insertion layer include greater than approximately nine atomic percent (90°) iron.

4. The structure of claim 2, wherein the other of the first insertion layer and the second insertion layer comprise CoFeX, where X is selected from the group consisting of boron tantalum, zirconium and nickel.

5. The structure of claim 4, wherein the at least one of the first insertion layer and the second insertion layer comprises CoFeB, wherein Fe is greater than about nine atomic percent (9%), and B is greater than about nine atomic percent (9%).

6. The structure of claim 1, wherein the first insertion layer has a thickness of less than approximately 10 Å and the second insertion layer has a thickness of less than approximately 10 Å.

7. The structure of claim 1, wherein the bottom ferromagnetic layer and the top ferromagnetic layer are selected from the group consisting of nickel-iron (NiFe) and cobalt-iron-boron (CoFeB).

8. The structure of claim 1, wherein the bottom ferromagnetic layer has a thickness greater than approximately 25 Å, and the second ferromagnetic layer has a thickness greater than approximately 25 Å.

9. The structure of claim 1, wherein the coupling layer comprises at least one of ruthenium, chromium, vanadium, molybdenum, and their alloys.

10. The structure of claim 1, wherein at least one of the first insertion layer or second insertion layer are selected from materials for which the structure inhibits oxygen encroachment.

11. The structure of claim 1, wherein the structure is further configured to provide a uniaxial anisotropy ($H_k$) of less than approximately 30 Oe.

12. The structure of claim 1, wherein the first insertion layer comprises cobalt-iron (CoFe) and the second insertion layer comprises cobalt-iron-boron (CoFeB).

13. A method for reducing temperature dependence in a magnetic tunnel junction comprising a coupling layer disposed between a fixed layer and a free-layer synthetic anti-ferromagnet structure, the free-layer synthetic anti-ferromagnet structure comprising a bottom ferromagnetic layer; a first insertion layer on the bottom ferromagnetic layer; a coupling layer on the first insertion layer; a second insertion layer on the coupling layer; and a top ferromagnetic layer on the second insertion layer;
  the method comprising:
    controlling the temperature dependence by:
      forming the first insertion layer with a first material; and
      forming the second insertion layer with a second material different from the first material;
    wherein the bottom ferromagnetic layer has a first temperature coefficient of $H_{sat}$, the first insertion layer has a second temperature coefficient of $H_{sat}$, the top ferromagnetic layer has a third temperature coefficient of $H_{sat}$, and the second insertion layer has a fourth temperature coefficient of $H_{sat}$, and wherein the second temperature coefficient of $H_{sat}$ is less than the first temperature coefficient of $H_{sat}$, and the fourth temperature coefficient of $H_{sat}$ is less than the third temperature coefficient of $H_{sat}$.

14. The method of claim 13, wherein the step of forming the first insertion layer includes forming a layer of material selected from the group consisting of CoFeB and CoFe, and the step of forming the second insertion layer includes forming a layer of the other of the material selected from the group consisting of CoFeB and CoFe, wherein iron content of the first insertion layer is greater than approximately nine atomic percent (9%), and iron content of the second insertion layer is greater than approximately nine atomic percent (9%).

15. The method of claim 14, wherein the iron content of the first insertion layer is less than approximately twenty five atomic percent (25%), and the iron content of the second insertion layer is less than approximately twenty five atomic percent (25%).

16. The method of claim 13, wherein the step of forming the first insertion layer includes forming a layer having a thickness of less than approximately 10 Å and the step of forming the second insertion layer includes forming a layer having a thickness of less than approximately 10 Å.

17. The method of claim 13, wherein the step of forming the bottom ferromagnetic layer and the step of forming the top ferromagnetic layer includes forming a layer of NiFe having a thickness greater than approximately 25 Å.

18. The method of claim 13, wherein the step of forming the bottom ferromagnetic layer and the step of forming the top ferromagnetic layer includes forming a layer of CoFeB having a thickness greater than approximately 25 Å.

* * * * *

UNITED STATES PATENT AND TRADEMARK OFFICE
CERTIFICATE OF CORRECTION

PATENT NO.        : 7,684,161 B2
APPLICATION NO.   : 11/406566
DATED             : March 23, 2010
INVENTOR(S)       : Srinivas Pietambaram et al.

It is certified that error appears in the above-identified patent and that said Letters Patent is hereby corrected as shown below:

Col. 5 Line 60 "insert ion" should be changed to --insertion--

Col. 6 Line 14 "90°" should be changed to --9%--

Signed and Sealed this

First Day of June, 2010

David J. Kappos
*Director of the United States Patent and Trademark Office*